(12) United States Patent
Ross

(10) Patent No.: US 6,457,169 B1
(45) Date of Patent: Sep. 24, 2002

(54) GEOMETRIC PHASE ANALYSIS FOR OVERLAY MEASUREMENT

(75) Inventor: Frances Mary Ross, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/495,876

(22) Filed: Feb. 2, 2000

Related U.S. Application Data

(62) Division of application No. 09/139,570, filed on Aug. 25, 1998, now Pat. No. 6,061,606.

(51) Int. Cl.$^7$ ............................................. G06F 17/50
(52) U.S. Cl. ............................................. 716/21; 716/4
(58) Field of Search ............................. 716/4, 5, 19, 21

(56) References Cited

U.S. PATENT DOCUMENTS

| | | |
|---|---|---|
| 3,840,749 A | 10/1974 | O'Keefe et al. |
| 5,100,237 A | 3/1992 | Wittekoek et al. |
| 5,481,362 A | 1/1996 | Van Den Brink et al. |
| 5,506,684 A | 4/1996 | Ota et al. |
| 5,917,604 A | 6/1999 | Dirksen et al. |
| 6,061,606 A * | 5/2000 | Ross ........................... 700/121 |

OTHER PUBLICATIONS

M.J. Hytch and L. Potez, Geometric phase analysis of high–resolution electron microscopy images of antiphase domains: example Cu3 Au, Mar. 12, 1997, Philosophical Magazine A, 1997, vol. 76, No. 6, 1119–1138.

* cited by examiner

*Primary Examiner*—Matthew Smith
*Assistant Examiner*—Leigh Marie Garbowski
(74) *Attorney, Agent, or Firm*—McGinn & Gibb, PLLC; Casey P. August

(57) ABSTRACT

A method of measuring overlay error comprises forming a first mask having a first alignment array comprising a periodic pattern of first features having a first periodicity, forming a second mask having a second alignment array comprising a pattern of second features having the first periodicity, the first alignment array being adjacent the second alignment array, the first alignment array and the second alignment array forming a combined alignment array, transforming the combined alignment array to produce a transformed array, selecting a first region within the transformed array, inverse transforming the region to produce geometric phase shift information, averaging the phase shift information, converting the averaged phase shift information into a value for misalignment in a first direction corresponding to the first region, repeating the selecting, inverse transforming, averaging and converting using a second region within the transformed array to calculate a value for misalignment in a second direction corresponding to the second region, calculating an overlay error between the first and second mask levels by adding the components of misalignment in the first direction and second direction.

9 Claims, 5 Drawing Sheets

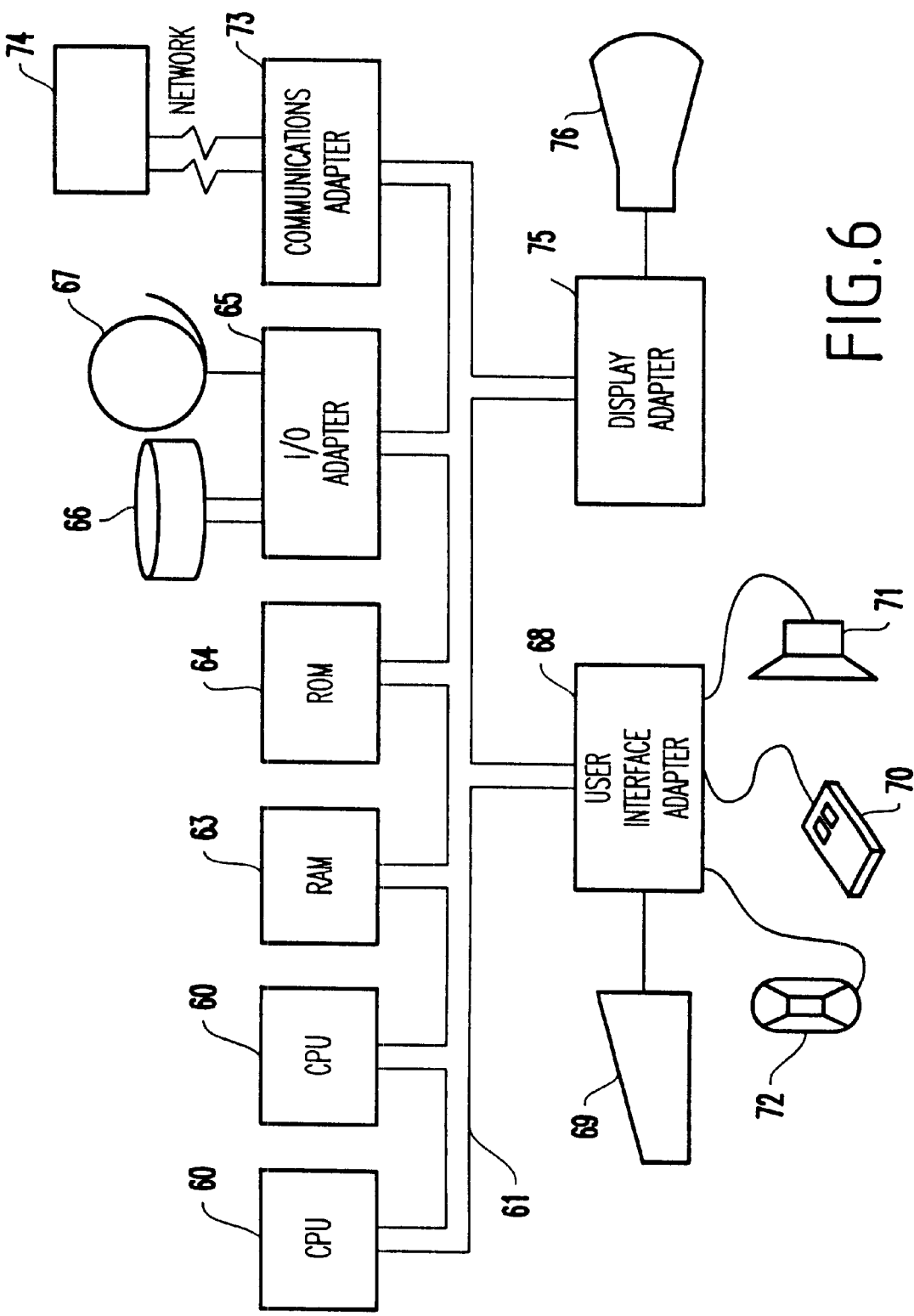

GEOMETRIC PHASE ANALYSIS FOR OVERLAY MEASUREMENT

This application is a division of U.S. application Ser. No. 09/139,570 filed Aug. 25, 1998, now U.S. Pat. No. 6,061,606 issued May 9, 2000.

BACKGROUND OF THE INVENTION

1. Field of the Invention

The present invention generally relates to methods for measuring the misalignment, or overlay error, between the patterns created on a wafer in different steps of the integrated circuit manufacturing process, and more specifically to improved methods of measuring misalignment which utilize geometric phase analysis.

2. Description of the Related Art

During the process of integrated circuit fabrication, several hundred processing steps may be required as thin layers of semiconductors, insulators and metals are deposited and patterned. The patterns in each layer of the integrated circuit are created using the process of lithography. A photosensitive resist ("photoresist") is deposited on the silicon wafer and exposed to light through a mask carrying the desired pattern. The photoresist is then developed and removed from areas corresponding to the pattern, allowing the pattern to be transferred by etching into the layer below.

With every generation of smaller and faster integrated circuits, the size of features in the masks is reduced, and the accuracy with which features in each layer must be aligned with those formed in previous layers must increase. Therefore, the problem of measuring the misalignment between features formed in different layers has become more critical. State of the art 64 Mb dynamic random access memory (DRAM) chips contain circuits with features as small as 250 nanometers (nm), and performance of the circuit is affected if one set of features is misaligned by more than about 10 nm from the set of features formed in previous processing steps. The placement precision, or cumulative difference between patterns from various mask levels, is commonly called "overlay error".

To measure the amount of misalignment, or overlay error, the industry currently makes use of an alignment technique illustrated in FIGS. 1A and 1B. Each mask includes several alignment areas, separate from the wiring or other pattern of the circuit. These alignment areas contain alignment marks which are cross-shaped or chevron-shaped features, usually several microns in length. FIG. 1A shows a plan view of such an alignment area.

The first alignment mark is etched onto the wafer at the first mask level (referred to hereafter as level "A") and subsequent levels are aligned with respect to this mark. In the example illustrated here, the alignment mark for level "A" consists of four large chevrons (labeled "10" in FIG. 1A) arranged at the corners of a 50×50 micron square. After level "A" is patterned using the mask, the chevrons are easily visible in an optical microscope. The next mask (referred to as level "B") is then exposed. Level "B" has a smaller set of chevrons (labeled 11) which, if accurately aligned, will fit within the larger chevrons of level "A". After exposure and development of the photoresist for level "B", the alignment mark for level "B" is faintly visible in the photoresist. By measuring the positions of the edges of the chevrons along a line L–L', as shown in FIG. 1B, the degree of misalignment (labeled 12 in FIG. 1B) in the x direction can be measured. A similar measurement is then done in the y direction. If the error is beyond acceptable tolerances, the photoresist is washed off and the exposure of the level B mask is repeated.

This technique was originally developed for much larger feature sizes, but after several years of optimization this technique is now being used to measure overlay error with an accuracy of 10 nm. This accuracy is sufficient for present day needs but will be inadequate for future generations of integrated circuits with smaller feature sizes requiring more precise alignment. For these smaller circuits, yield problems occur when the conventional technique measures an acceptable overlay error and allows the wafer to be fully processed, but it is later found that there is poor performance due to an overlay error smaller than can be resolved using the technique.

A separate problem of the conventional technique is that it relies on measurements of large alignment marks, several microns in size, whereas the features in the actual circuits are much smaller, of the order of 250 nm (or 0.25 microns). Large alignment marks are used because they are visible in an optical microscope and therefore can easily be measured: the optical microscope can resolve features down to about 250 nm. However, since the processing is optimized for the smaller features in the circuit, the edges of the large alignment marks may be improperly etched, making it difficult to measure their positions. More importantly, it may be difficult to relate the position of the large alignment marks to the positions of the small features in the actual circuits, because large and small features are etched at different rates during processing.

To improve measurement accuracy, and to avoid the problems associated with using large alignment marks, several other overlay measurement techniques have been suggested, such as techniques based on moire fringes. In moire fringe techniques, the alignment marks are large areas filled with a regular pattern of small lines or dots.

In a typical example of a moire fringe technique, an alignment mark consisting of a regular pattern of dots is etched onto the wafer at the first mask level (again referred to as level "A"). The next mask level "B" is then exposed. The alignment mark for level "B" also consists of a regular pattern of dots and these are superimposed over the level "A" pattern. However, the level "B" pattern has a slightly different spacing between dots. Because of this difference in spacing, in some places the "A" and "B" dots are in registry, i.e. superimposed exactly, but in other places they are out of registry. Although individual dots are too small to see clearly in an optical microscope, the areas where dots are in and out of registry (the "moiré fringes") can be distinguished optically. Visual inspection of the position of these areas is used to determine the overlay error.

By using alignment marks which are made up of many small dots or lines, moiré fringe techniques avoid the problems associated with using large features for alignment marks. However, other significant problems occur with moiré fringe techniques. Three problems are worth noting. Firstly, once the level "A" pattern of dots is etched onto the wafer, it forms a non-planar surface on which the level "B" pattern must be placed. This can distort the level "B" pattern and make it difficult to expose and develop correctly. A second problem is that the level "B" pattern shows very weak contrast (since it is only patterned in photoresist) compared to level "A" (which is etched onto the wafer). When superimposed onto the high contrast level "A" pattern, level "B" is very difficult to see, making the moiré fringes weak and the measurement less precise. A third problem is that the difference in spacing between levels "A"

and "B" must be small (around 1%) and carefully controlled in order to get appropriate moiré fringes and this can be difficult to achieve.

The invention to be described below is significantly different from both the moiré and conventional techniques which have just been described, in that it uses a different type of alignment mark combined with mathematical analysis to measure the overlay error. This enables the problems described above to be avoided while also allowing an improved accuracy in the measurement of overlay error.

SUMMARY OF THE INVENTION

The object of the present invention is to provide a structure and method for measuring the overlay error between at least two mask levels, each of which includes specific alignment marks. These alignment marks consist of repeating patterns of small dots or other features. All marks have the same spacing between features, and alignment marks from successive mask levels are placed next to each other. Mathematical analysis of the aligmnent marks is then used to calculate the overlay error with a high degree of accuracy. For this, the invention makes use of mathematical techniques for the analysis of periodically repeating patterns, such as geometric phase analysis and other techniques involving Fourier transforms.

More specifically, the invention comprises a method of measuring overlay error comprising forming a first mask having a first alignment array comprising a periodic pattern of first features having a first periodicity, forming a second mask having a second alignment array comprising a pattern of second features having the first periodicity, the first alignment array being adjacent the second alignment array, the first alignment array and the second alignment array forming a combined alignment array, transforming the combined alignment array to produce a transformed array, selecting a first region within the transformed array, inverse transforming the region to produce geometric phase shift information, averaging the phase shift information, converting the averaged phase shift information into a value for misalignment in a first direction corresponding to the first region, repeating the above steps using a second region within the transformed array to calculate a value for misalignment in a second direction corresponding to the second region, calculating an overlay error between the first and second mask levels by adding the components of misalignment in the first direction and second direction. The transforming step comprises calculating a Fourier transform and the inverse transforming step comprises calculating an Inverse Fourier transform.

The invention can be used for accurate measurement of the overlay error between mask layers during the fabrication of circuits with a small feature sizes of around 250 nm and below. The invention is significantly different from, and has advantages over, both conventional and moiré techniques for overlay measurement. Overlay error is measured with an accuracy of better than 2.5 nm, an improvement of at least four times over the accuracy achieved using conventional techniques, and the invention avoids the problems which have already been described for conventional and moiré techniques.

BRIEF DESCRIPTION OF THE DRAWINGS

The foregoing and other objects, aspects and advantages will be better understood from the following detailed description of preferred embodiments of the invention with reference to the drawings, in which:

FIG. 6 is a schematic diagram of a computer system for implementing the invention.

DETAILED DESCRIPTION OF PREFERRED EMBODIMENTS OF THE INVENTION

Figure 1A:
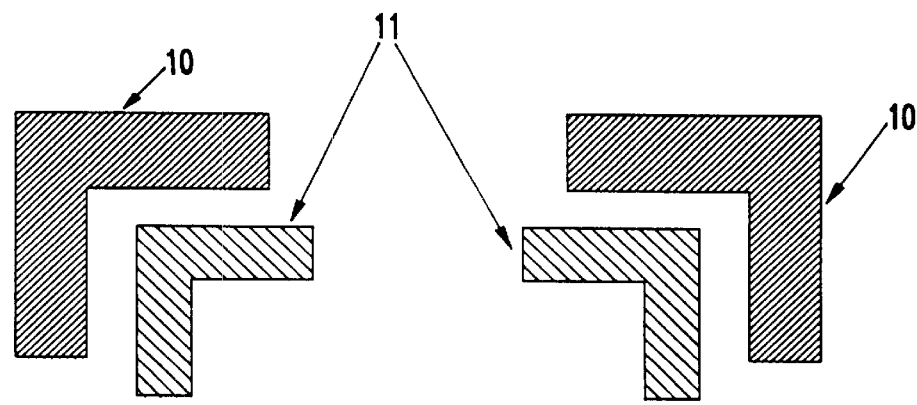
FIG. 1A is a schematic drawing of the alignment area used in a conventional technique for measuring overlay error in two directions.
Figure 1A:
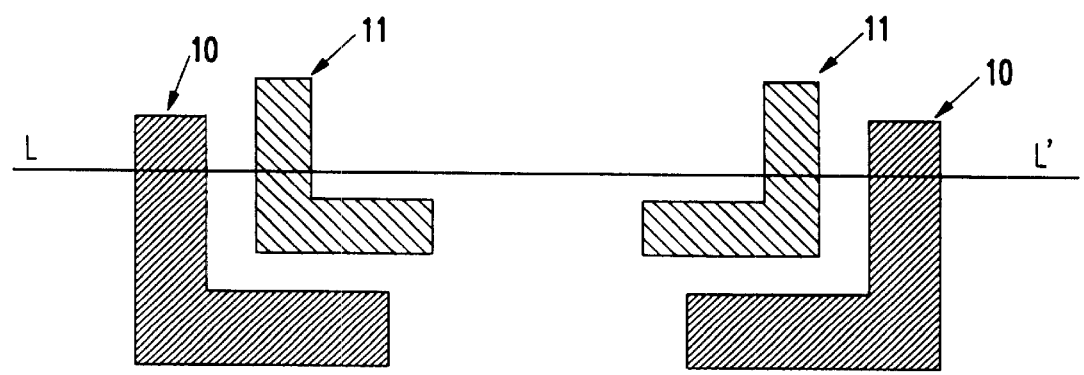
Figure 1B:
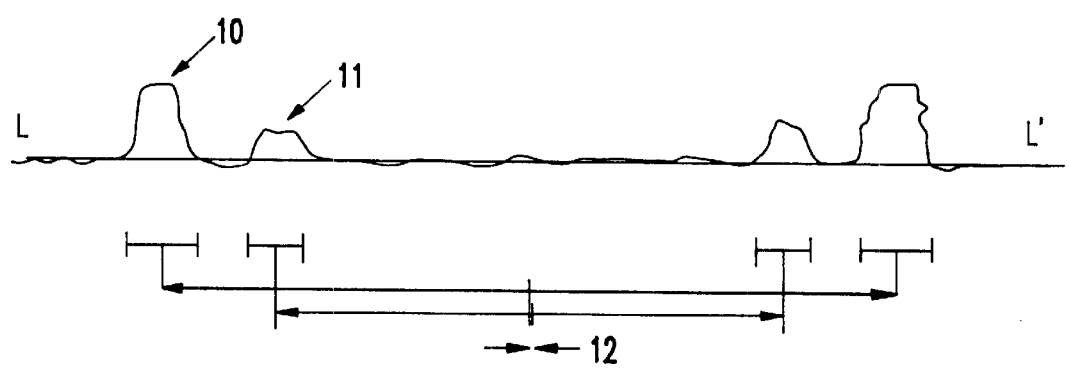
FIG. 1B is a schematic drawing of a line scan made along line L–L' of FIG. 1A, showing how overlay error is measured with the conventional technique in one direction (the x direction)

Referring now to the drawings, the inventive technique for the measurement of overlay error using geometric phase analysis is illustrated. The discussion of the invention begins by describing the alignment marks which are used in this technique, and then describe mathematical calculations, using the technique of geometric phase analysis, with which the overlay error can be measured from these alignment marks.

Figure 2A:
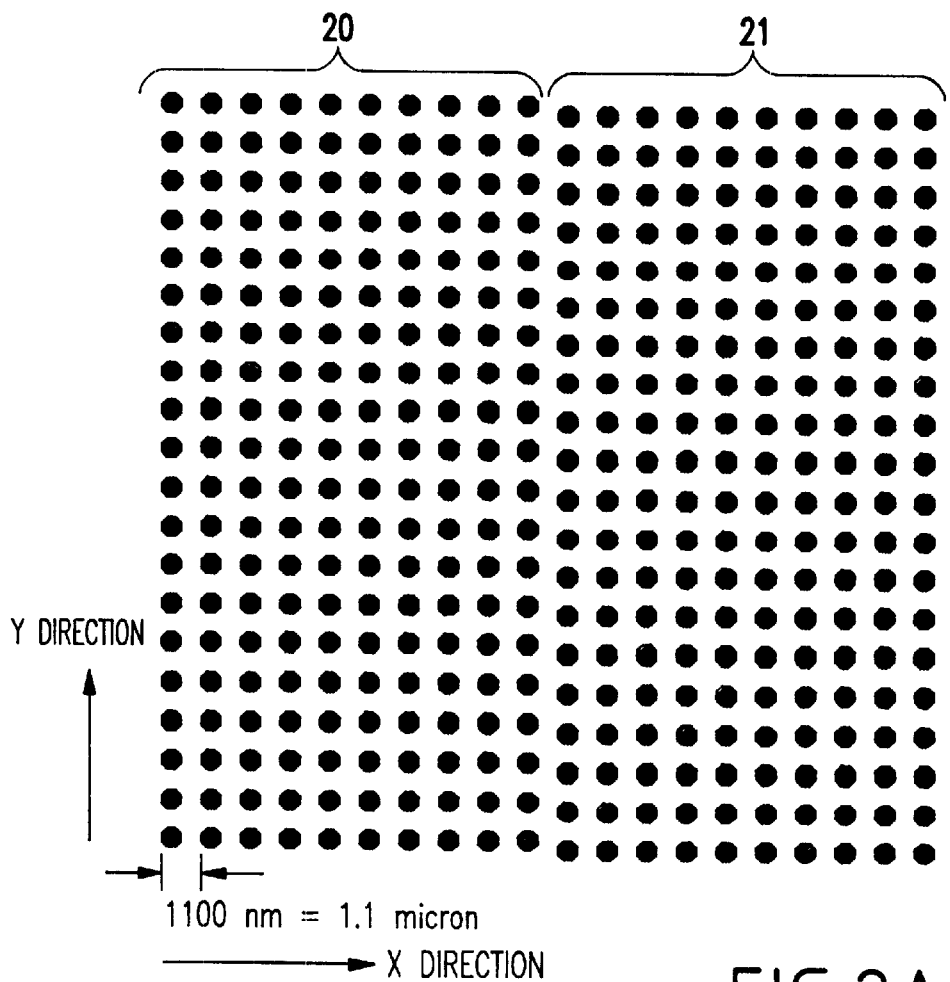
FIG. 2A is a schematic drawing of the alignment area used in the present invention for measuring overlay error in two directions.

FIG. 2A shows the alignment marks used in the present technique, which consist of regular arrays of small dots or other features. The alignment marks are formed in an alignment area which is separate from the wiring pattern area of the masks.

At the first mask level, referred to hereafter as level "A", an alignment mark (labeled 20 in FIG. 2A) is etched into the wafer. In a preferred embodiment, this alignment mark comprises an array of 10×20 small dots, each dot being 550 nm across with a spacing between dots of 550 nm. Therefore, in the example illustrated, the level "A" array occupies an area of 11×22 microns.

The next mask level "B" is then exposed onto photoresist on the wafer. The alignment mark for level "B" is labeled 21 in FIG. 2A and is intentionally shown slightly misaligned. It can be seen that, unlike the moiré fringe technique discussed above, the arrays for levels "A" and "B" have the same periodicity as each other, and are placed next to each other rather than superimposed. The result is a "combined alignment array" which in this case is a square of size 22×22 microns.

The invention measures the misalignment between the two halves of the combined alignment array. To measure the misalignment, the invention analyses the difference in position, or "geometric phase difference", between dots in the two arrays. In the preferred embodiment of the invention, a series of calculations requiring the mathematical technique of Fourier Transforming is performed to determine the geometric phase difference. The difference in position is analyzed separately in two directions to give the misalignment in two directions. The preferred embodiment uses the x and y directions although any two different directions can be chosen.

Figure 2B:
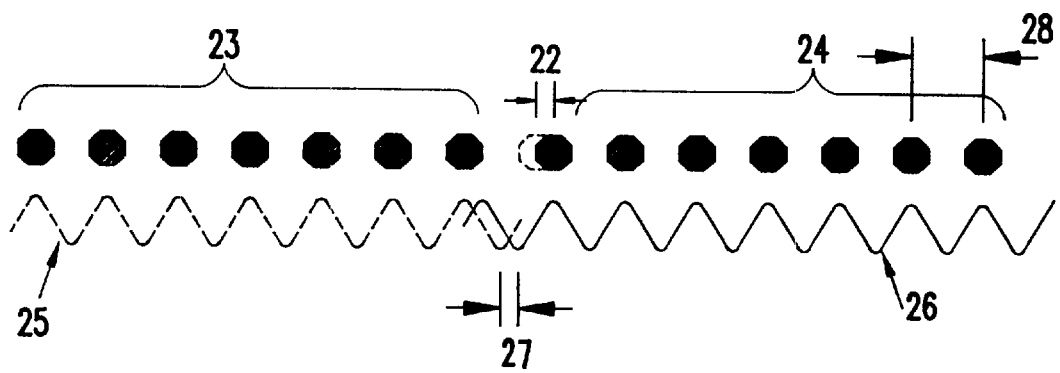
FIG. 2B is a schematic drawing of the alignment area used in a one-dimensional analog of FIG. 2A, to measure overlay error in one direction.

The technique is best understood by reference to a simpler example given in FIG. 2B. FIG. 2B represents a one-dimensional version of the technique, where misalignment must be measured in only one direction. By first describing in general terms how the invention works in this one-dimensional example, it will be easier to explain how the calculation is done in the two-dimensional array shown in FIG. 2A.

The measurement required is the overlay error, labeled 22, between the two rows of dots 23 and 24 which correspond to levels "A" and "B" respectively. The relationship between the alignment marks and the pattern of wiring on the level "A" and "B" masks is chosen so that if the overlay error 22 is zero, the level "A" and "B" wiring in the circuit will be perfectly aligned. Because of irregularities in the positions of individual dots, it is inaccurate simply to measure the spacing between the closest dots in the two rows 23 and 24. Instead, a perfectly periodic curve 25 (here we use a sinusoidal curve) is fitted over the left hand row 23, using mathematical techniques to be described below, and separately a sinusoidal curve 26 of identical periodicity is fitted over the right hand side 24. By fitting these curves over every dot in rows 23 and 24, inaccuracies in the positions of individual dots are averaged out, improving the overall measurement accuracy. When curve 25 is extended over the right hand side, it can be seen that because of the misalignment there is a lateral displacement, labeled 27, between curves 25 and 26. This lateral displacement, or "geometric phase difference", can be calculated using Fourier transform techniques which will be described below.

The result of the calculation is expressed in degrees (where, for example, a geometric phase difference of zero degrees means that the arrays are perfectly aligned and a geometric phase difference of 180° means that the arrays are exactly out of phase). The final stage of the calculation is therefore to convert the geometric phase difference expressed in degrees into an overlay error expressed in nm by using the fact that a phase difference of 360° is equivalent to a displacement of one dot spacing, labeled 28 in FIG. 2B (1100 nm in this case).

Note that this technique is unable to measure an overlay error greater than the spacing between dots, since for example an overlay error of exactly one dot spacing will give a geometric phase difference of zero. In practice, this is not likely to be a problem since state of the art lithography tools can align successive masks to much better than the dot spacings which might be chosen. However, the technique can be combined with a conventional chevron technique to measure gross misalignment if necessary.

The measurement of overlay error in two dimensions, is discussed blow with reference to the combined alignment array shown in FIG. 2A. The combined alignment array on the wafer is photographed, digitized and input into a computer. In a preferred embodiment of the invention the result is a stored image of dimensions 1024×1024 pixels, where the value of each pixel is determined by the brightness of the corresponding area of the original photograph.

A series of mathematical operations involving Fourier transformation, shifting and averaging is now performed on the stored image. All the operations to be described can be carried out using a personal computer running a commonly available image processing package, such as the image processing package available from Digital Micrograph, Pleasanton, Calif., USA. Although each step is described individually and in detail below, the total computational time required is small, of the order of a few seconds. In a preferred embodiment of the invention, these steps would be automated to minimize the total time required per wafer.

To begin the analysis, the Fourier Transform of the stored image of the combined alignment array is calculated. The Fourier Transform is also a two dimensional image, and, like the image of the combined alignment array, it may be stored digitally in the computer and displayed on a cathode ray tube (CRT) display.

As would be known by one ordinarily skilled in the art given in this disclosure, the Fourier Transform is calculated using the equation $$G(u,v) = \partial F(x,y) e^{-2\pi i(ux+vy)} dx\, dy.$$

Here $F(x,y)$ is the value of the pixel at position $(x,y)$ in the combined alignment array, and $G(u,v)$ is the value of the pixel at position $(u,v)$ in the Fourier Transform of the combined alignment array. From this equation it can be seen that the pixels $G(u,v)$ in the Fourier Transform will be complex numbers (even though the pixels in the combined alignment array have real values). Note that the whole of the combined alignment array, i.e. both halves of the image, are transformed together in this operation.

Figure 3:
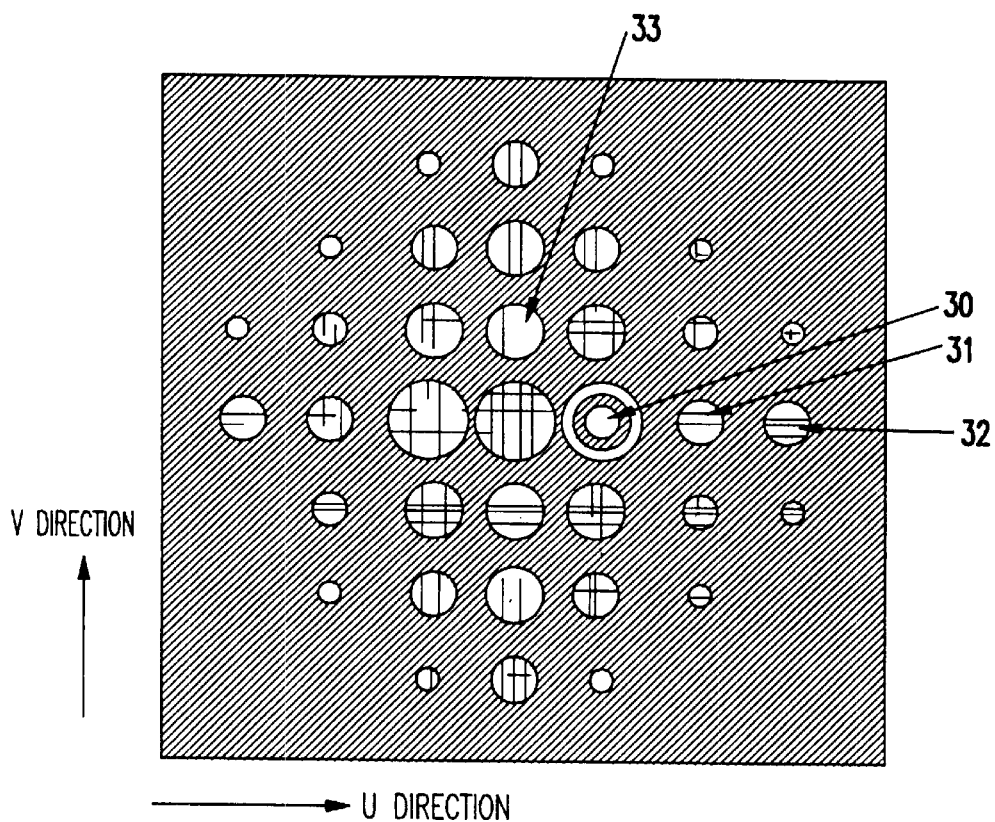
FIG. 3 is a schematic drawing of a Power Spectrum of the alignment area illustrated in FIG. 2A.

FIG. 3 illustrates the results of the calculation. Rather than showing the Fourier Transform directly, FIG. 3 instead shows the Power Spectrum which is calculated simply by squaring the modulus of the Fourier Transform. The Power Spectrum is shown because it illustrates the important features of the Fourier Transform, but is easier to depict because its pixels have real values rather than complex values.

It can be seen that the Fourier Transform consists of a pattern of peaks having high intensity values, surrounded by a background of low or zero intensities. Each peak is made up of a group of 3×3 or more bright pixels and the peaks are arranged regularly throughout the Fourier Transform.

The Fourier Transform is now manipulated mathematically to determine the overlay error. Before describing how this can be done, we consider how the information about the overlay error is represented in the Fourier Transform.

As would be known by one ordinarily skilled in the art given in this disclosure, any image, such as the array in FIG. 2A, can be thought of as being made up by superimposing a large number of regular sinusoidal waves, much as the irregular surface of the ocean is determined by the superposition of many regular ocean waves. Each wave goes in a different direction and has a different amplitude (height), frequency (or wavelength) and phase. The Fourier Transform of any image is a recipe or ingredient list showing which amplitudes, frequencies, phases and directions are present in that image. The horizontal and vertical directions in "transform space", i.e. u and v in FIG. 3, represent the frequencies of waves going in the x and y directions in "real space", and the value of each pixel in the Fourier Transform $G(u,v)$ gives the phase and amplitude of the wave with frequency $(u,v)$.

The bright peaks in FIG. 3 therefore represent frequencies which appear strongly in FIG. 2A. For example, the peak labeled 30 in FIG. 3 represents a sinusoidal wave going horizontally (in the x direction) whose wavelength is equal to the spacing between dots in FIG. 2A: this wave (the "fundamental frequency") is obviously an important component of the image in FIG. 2A and therefore has a large amplitude in FIG. 3. The peak labeled 31 is another horizontal wave but with double the frequency, or half the wavelength; it can be thought of as a "second harmonic" and also appears strongly in FIG. 2A. Peak 32 is the third harmonic in the x direction, while peak 33 is the fundamental frequency in the y direction. The dark areas represent frequencies which are not present in FIG. 2A.

All the information in FIG. 2A (including of course the relationship between both halves of the pattern) is also stored in FIG. 3, and each part of FIG. 3 carries a particular portion of the information. Two aspects of the information are important for the measurement of overlay error using Fourier Transform techniques:

The information about the amount of misalignment in the x and y directions is carried in the value of G(u,v) at the two fundamental frequencies 30, 33. To understand why this is so, suppose that the misalignment in say the x direction were zero. FIG. 2A would be perfectly periodic in the x direction (apart from random errors in the position of each dot) and a single frequency and phase in peak 30 of the Fourier Transform "recipe" would be sufficient to specify every dot position in the x direction. If misalignment is present, a frequency which matches one side of FIG. 2A would be out of phase with the other side; a second wave with the same frequency but with a different phase would be required in the Fourier Transform. Both waves will contribute to the value of the Fourier Transform at the fundamental frequency.

Furthermore, the spatial information (i.e. that the right hand side of the image has one value of phase, and the left hand side has a second value) is carried in the pixels immediately adjacent to the fundamental frequency. This group of satellite pixels making up peak 30 comprise an "envelope function" surrounding the fundamental frequency. As is known to those skilled in the art, the nature of this group of satellite waves is related to the spatial extent of the two regions with different phase in the original image.

Thus to determine the overlay error in the x direction, the value of the Fourier Transform at the exact position of the fundamental frequency in peak 30 must be analyzed to measure the phases of both components of the fundamental frequency, while the spatial information in the envelope function must be retained so that the phases of the two halves of the alignment array can be distinguished. In a preferred embodiment, this is done in the following way:

Firstly, the center of peak 30 is determined by fitting a Gaussian curve to the peak, using processes well known to those ordinarily skilled in the art. It is important to find the fundamental frequency exactly (to sub-pixel accuracy), but the width of peak 30 can make it difficult to measure the center of the peak accurately. However, as will be shown below, any errors in measuring the fundamental frequency can be compensated for later.

Secondly, the information from peak 30 is separated from the rest of the information in the Fourier Transform. This is done by drawing a circle around the peak with an appropriate radius (in this example, a radius of 3.5 pixels is large enough to include the pixels in the envelope function while excluding pixels from neighboring peaks such as 31 in FIG. 3), setting the value of every pixel outside this circle to zero ("masking"), and then shifting the peak to the center (or origin) of the Fourier Transform.

Thirdly, the masked and shifted peak 30 is converted back into an image in real space by calculating an Inverse Fourier Transform. As is known by those skilled in the art of Fourier analysis, the result of this operation is an image whose value at every point gives the phase and amplitude of the fundamental wave at that particular position in the original image (of the combined alignment array). The Inverse Transform is calculated using the equation $$F'(x,y) = (1/2\pi) \oint G'(u,v) e^{2\pi i(ux+vy)} du\, dv.$$

Here G'(u,v) is the value of the pixel at position (u,v) in the masked and shifted Fourier Transform of the combined alignment array, and F'(x,y) is the value of the pixel at position (x,y) in the Inverse Transform. Pixels in both G'(u,v) and F'(x,y) will have complex values.

Figure 4:
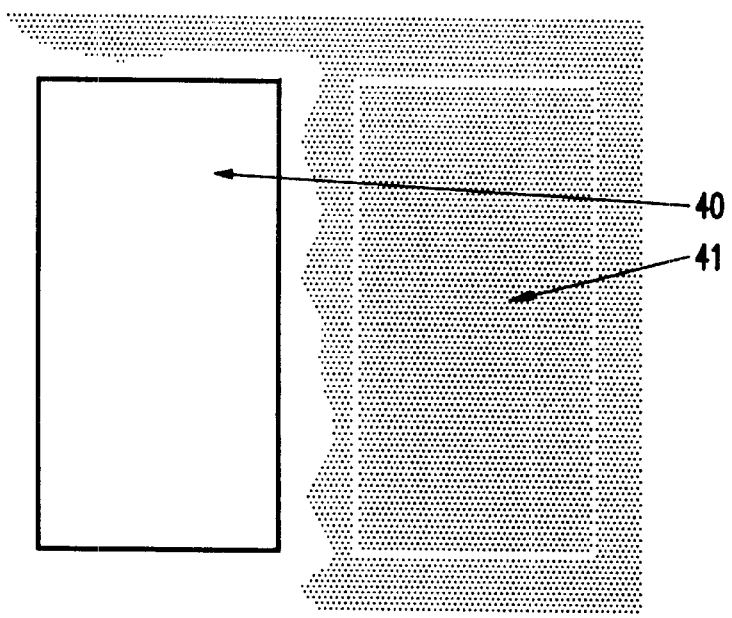
FIG. 4 is a schematic drawing of the Geometric Phase Map, or the imaginary part of the Inverse Fourier Transform, of the small region of FIG. 3 enclosed by the circle.

Fourthly, the phase information is separated from the amplitude information in the Inverse Transform by calculating the imaginary part of the Inverse Transform. FIG. 4 illustrates the result of this calculation. Each pixel in this image gives the value of the phase of the fundamental wave at that particular position in the original alignment array. This type of phase information is referred to by those ordinarily skilled in the art as a "geometric phase map". In this example it shows clearly a difference in the phase of the fundamental wave between the left and right hand sides of the image. Irregularities in the positions of individual dots account for the fluctuations in the phase.

Fifthly, the phase difference between the two sides is calculated. The values of pixels within two areas on either side, labeled 40 and 41 in FIG. 4, are averaged. These areas are chosen to avoid computational effects arising from proximity to the edge of the image. The average of area 40 is subtracted from the average of area 41. The difference is converted into an average displacement (in terms of nanometers) by utilizing the mathematical principle that a phase difference of 360° corresponds to an image shift of one dot spacing.

The importance of determining exactly the frequency of the fundamental wave was emphasized previously. The geometric phase map in FIG. 4 provides a convenient way for testing whether the correct value of the fundamental frequency was determined. Suppose that an error occurs in finding the fundamental frequency in the first step, so that instead of being shifted to the origin the fundamental frequency is only shifted to distance d from the origin. As is known to those skilled in the art, once the above calculations are performed, this error would result in a factor $-2\pi dx$ being added to the geometric phase map. It would look as if a uniform ramp or slope were added to the geometric phase map, making it change gradually from bright to dark on each side instead of taking a constant value on one side and a different but also constant value on the other side. By looking at a part of the geometric phase map in which the average phase should be constant, such as area 40 in FIG. 4, the presence of any such ramp can be detected and subtracted from the whole geometric phase map before averaging areas 40 and 41.

Finally, a second similar analysis is done on spot 33 in FIG. 3 to determine overlay error in the y direction.

Figure 5:
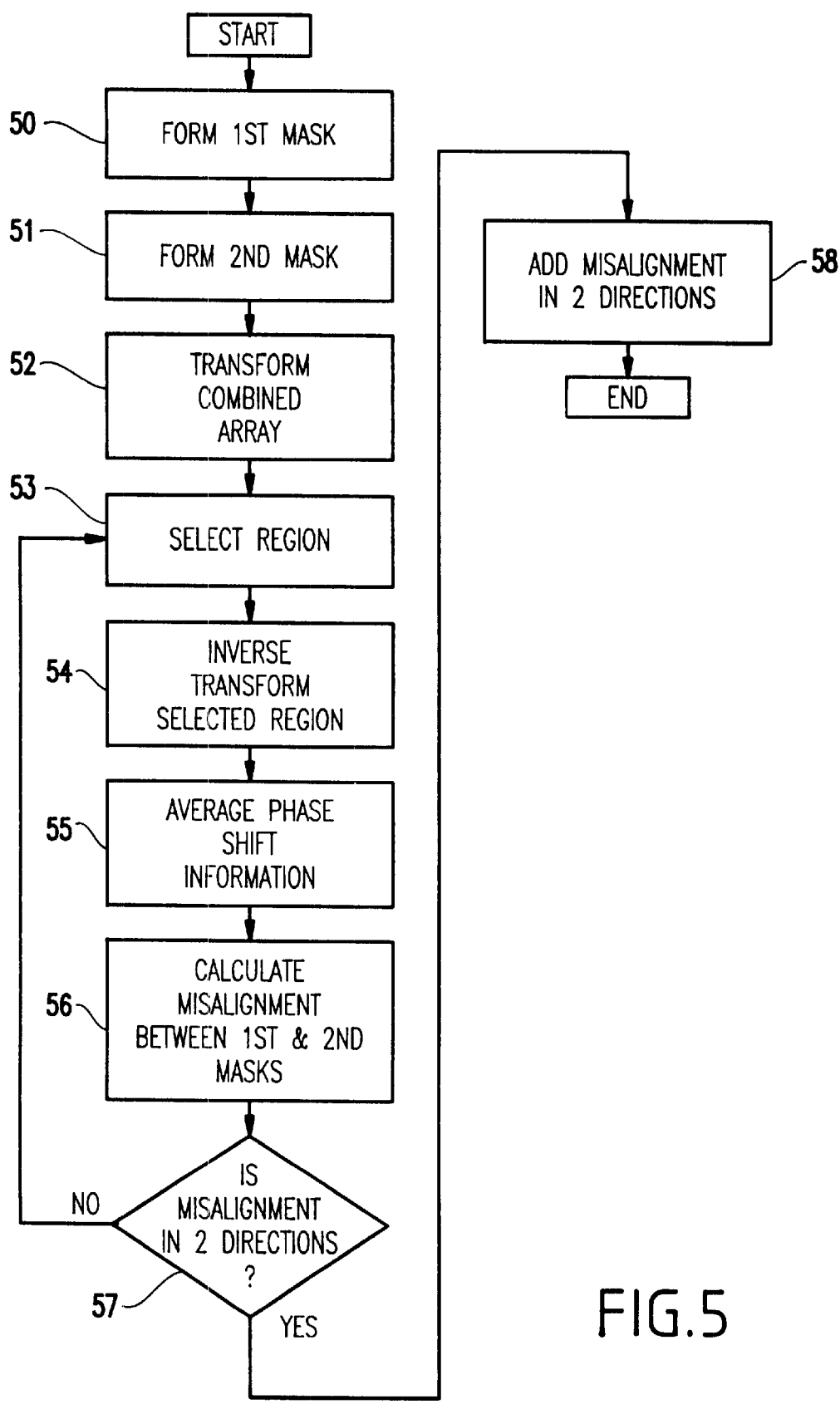
FIG. 5 is a flow chart illustrating a preferred embodiment of the invention.

The above process is illustrated in FIG. 5. More specifically, FIG. 5 illustrates a method of measuring overlay error comprising forming a first mask having a first alignment array comprising a periodic pattern of first features 50, forming a second mask having a second alignment array comprising a pattern of second features having the same periodicity as the first alignment array 51, the first alignment array being adjacent the second alignment array, the first alignment array and the second alignment array forming a combined alignment array. The process also includes transforming the combined alignment array to produce a transformed array 52, selecting a first region within the transformed array 53, inverse transforming the region to produce geometric phase shift information 54, averaging the phase shift information 55, converting the averaged phase shift information into a value for misalignment in a first direction corresponding to the first region 56, repeating the above steps using a second region within the transformed array to calculate a value for misalignment in a second direction corresponding to the second region 57 and calculating an overlay error between the first and second mask levels by adding the components of misalignment in the first direction and second direction 58.

The method described above was tested to determine the accuracy of measurements made using the technique. The overlay error in test patterns was calculated to within 2 nm, and testing also showed that it is possible to increase the accuracy further by digitizing with smaller pixel sizes. Thus with dedicated hardware allowing finer digitization, the resolution can be further increased.

A representative hardware environment for practicing the present invention is depicted in FIG. 6, which illustrates the typical hardware configuration of an information handling/computer system in accordance with the subject invention having at least one processor or central processing unit (CPU) 60. CPUs 60 are interconnected via system bus 61 to a random access memory (RAM) 63, read-only memory (ROM) 64, input/output (I/O) adapter 65 for connecting peripheral devices such as disk units 65 and tape drives 67 to bus 61, user interface adapter 68 for connecting keyboard 69, mouse 70, speaker 71, measurement tool 72, and/or other user interface devices such as touch screen device (not shown) to bus 61, communication adapter 73 for connecting the information handling system to a data processing network and/or a lithography system 74, and display adapter 75 for connecting bus 61 to display device 76.

In a preferred embodiment of the invention a charge coupled device (CCD) camera is added directly to the optical microscope in a conventional overlay measurement tool. This enables a digital CCD image of the combined alignment array to be recorded and sent directly to a computer, avoiding the steps described above of photographing the wafer and digitizing the result and thereby speeding up the operation of the invention. An array size of 1024×1024 was used in the analysis described here, but with a 2048×2048 CCD, which is commercially available from many manufacturers, such as Gatan, Inc., Pleasanton, Calif., USA, digitization can be carried out at twice the spatial resolution, thereby doubling the accuracy.

The inventive arrays can be placed within the conventional alignment marks discussed above with respect to FIG. 1A. The area required (22×22 microns) will fit within the 50 micron square used in the conventional technique. The conventional technique may then be used to check for gross overlay error while the present technique gives a refined value.

This invention presents several advantages over conventional and moiré alignment techniques. Compared to conventional techniques, the accuracy is higher; furthermore, the patterns used are those for which the lithography is optimized. Compared to moiré techniques, there is no need to fabricate arrays with precise differences in spacing. Since the arrays are not superimposed, the alignment mark on the second level, which has low contrast because it is only patterned in photoresist, can be distinguished more easily. Unlike moiré techniques, the method can easily be extended to allow multiple layers to be aligned. Since the alignment arrays are not superimposed, several layers can be aligned, each with respect to the previous one, by patterning arrays of dots near to each other.

A specific advantage of the present technique is that information is collected over a large area so the algorithm is insensitive to position errors in individual features of the array. Also, even though small features are used in the alignment marks, an optical microscope (connected to either a camera or a CCD) can be used to acquire the image used in the analysis. This is because it is not necessary to resolve the exact shape of each dot precisely: since only the lowest (fundamental) frequencies are used in the analysis, the shapes of individual dots do not influence the results and dots which are close to the resolution limit of the optical microscope can be used. This is convenient because the feature sizes used in future generations of circuits are close to the resolution limit (about 250 nm) of the optical microscope. Finally, there is no need for the two alignment arrays to contain identical patterns, so long as their periodicity is identical, so the technique can be applied using different patterns on each mask level if desired.

The benefits seen from this invention will primarily be related to the improved yield which will become possible in the fabrication of integrated circuits with small feature sizes. However, geometric phase analysis is sensitive to defects and distortions in any regular array, and not just in an alignment array. The actual working elements of the DRAM structure comprise such a regular array, and so the invention can also be useful in detecting small distortions and defects in the working element of circuits such as DRAMs.

While the invention has been described in terms of preferred embodiments, those skilled in the art will recognize that the invention can be practiced with modification within the spirit and scope of the appended claims.

What is claimed is:

1. A method of measuring overlay error comprising:
   forming a first mask having a first alignment array comprising a periodic pattern of first features having a first periodicity;
   forming a second mask having a second alignment array comprising a pattern of second features having said first periodicity, said first alignment array being adjacent said second alignment array, said first alignment array and said second alignment array forming a combined alignment array; and
   mathematically analyzing positions of said first features and said second features in said combined alignment array to produce an overlay error between the first and second mask levels.

2. The method in claim 1, wherein said mathematical analyzing comprises:
   transforming said combined alignment array to produce a transformed array;
   selecting a region within said transformed array;
   inverse transforming said region to produce geometric phase shift information; and
   converting said phase shift information into a value for misalignment in a direction corresponding to said region.

3. The method in claim 2, further comprising:
   repeating said selecting, inverse transforming and converting using a second region within said transformed array to calculate a value for misalignment in a second direction corresponding to said second region;
   calculating said overlay error between the first and second mask levels by adding the components of misalignment in said first direction and second direction.

4. The method in claim 2, further comprising, after said inverse transforming, averaging said phase shift information.

5. The method in claim 2, wherein said transforming comprises calculating a Fourier transform and said inverse transforming comprises calculating an Inverse Fourier transform.

6. The method in claim 1, wherein said mathematical analyzing comprises:

transforming said combined alignment array to produce a transformed array;

selecting a first region within said transformed array;

inverse transforming said region to produce geometric phase shift information;

averaging said phase shift information;

converting said averaged phase shift information into a value for misalignment in a first direction corresponding to said first region;

repeating said selecting, inverse transforming, averaging and converting using a second region within said transformed array to calculate a value for misalignment in a second direction corresponding to said second region; and calculating said overlay error between the first and second mask levels by adding the components of misalignment in said first direction and second direction.

7. The method in claim 6, wherein said transforming comprises calculating a Fourier transform and said inverse transforming comprises calculating an Inverse Fourier transform.

8. A method of measuring overlay error comprising:

forming a first mask having a first alignment array comprising a periodic pattern of first features having a first periodicity;

forming a second mask having a second alignment array comprising a pattern of second features having said first periodicity, said first alignment array being adjacent said second alignment array, said first alignment array and said second alignment array forming a combined alignment array;

transforming said combined alignment array to produce a transformed array;

selecting a first region within said transformed array;

inverse transforming said region to produce geometric phase shift information;

averaging said phase shift information;

converting said averaged phase shift information into a value for misalignment in a first direction corresponding to said first region;

repeating said selecting, inverse transforming, averaging and converting using a second region within said transformed array to calculate a value for misalignment in a second direction corresponding to said second region; and calculating an overlay error between the first and second mask levels by adding the components of misalignment in said first direction and second direction.

9. The method in claim 8, wherein said transforming comprises calculating a Fourier transform and said inverse transforming comprises calculating an Inverse Fourier transform.

* * * * *